United States Patent
Lee

(10) Patent No.: US 11,619,658 B2
(45) Date of Patent: Apr. 4, 2023

(54) SEMICONDUCTOR INTEGRATED FLUXGATE DEVICE SHIELDED BY DISCRETE MAGNETIC PLATE

(71) Applicant: Texas Instruments Incorporated, Dallas, TX (US)

(72) Inventor: Dok Won Lee, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1194 days.

(21) Appl. No.: 15/836,534

(22) Filed: Dec. 8, 2017

(65) Prior Publication Data

US 2019/0178915 A1 Jun. 13, 2019

(51) Int. Cl.
*G01R 15/18* (2006.01)
*G01R 19/00* (2006.01)
(Continued)

(52) U.S. Cl.
CPC ....... *G01R 15/183* (2013.01); *G01R 19/0092* (2013.01); *H01L 23/544* (2013.01);
(Continued)

(58) Field of Classification Search
CPC .. G01R 15/183; G01R 19/0092; G01R 33/04; G01R 15/186; G01R 15/185;
(Continued)

(56) References Cited

U.S. PATENT DOCUMENTS 7,545,662 B2 6/2009 Wang
7,598,601 B2 * 10/2009 Taylor .................. G01R 15/207
174/536
(Continued)

OTHER PUBLICATIONS

"DRV421 Integrated Magnetic Fluxgate Sensor for Closed-Loop Current Sensing", Product Datasheet, Texas Instruments Incorporated, Mar. 2016, accessed Dec. 8, 2017, http://www.ti.com/lit/ds/symlink/drv421.pdf.
(Continued)

*Primary Examiner* — Lee E Rodak
(74) *Attorney, Agent, or Firm* — Dawn Jos; Frank D. Cimino

(57) ABSTRACT

A current-sensing system includes a conductor for carrying a first electrical current generating a first magnetic field. A device, spaced from the conductor by a clearance, includes a semiconductor integrated circuit die in a package. The semiconductor integrated circuit die includes at least one elongated bar of a first ferromagnetic material magnetized by the first magnetic field; a sensor comprising a first coil wrapped around the at least one elongated bar to sense the bar's magnetization; and an electronic driver creating a second electrical current flowing through a second coil wrapped around the at least one elongated bar generating a second magnetic field to compensate the at least one bar's magnetization. The package has a first outer surface free of device terminals. A discrete plate of a second ferromagnetic material is positioned in the clearance and is conformal with the first outer surface of the package.

10 Claims, 7 Drawing Sheets

(51) Int. Cl.
*H01L 23/544* (2006.01)
*H01L 23/498* (2006.01)
*H01L 23/31* (2006.01)

(52) U.S. Cl.
CPC .... *H01L 23/3107* (2013.01); *H01L 23/49805* (2013.01); *H01L 2223/54426* (2013.01); *H01L 2223/54486* (2013.01)

(58) Field of Classification Search
CPC ......... H01L 23/544; H01L 2223/54486; H01L 2223/54426; H01L 23/49805; H01L 23/3107
See application file for complete search history.

(56) References Cited

U.S. PATENT DOCUMENTS

| | | | | |
|---|---|---|---|---|
| 7,612,553 | B2* | 11/2009 | Kinzel | G01R 33/07 324/117 H |
| 9,529,013 | B2* | 12/2016 | Racz | G01R 1/0416 |
| 9,577,185 | B1* | 2/2017 | Lee | H01L 43/12 |
| 2003/0024723 | A1* | 2/2003 | Igarashi | C08G 59/621 174/521 |
| 2004/0080308 | A1* | 4/2004 | Goto | G01R 15/202 324/117 H |
| 2007/0080676 | A1* | 4/2007 | Racz | G01R 15/207 324/117 H |
| 2014/0197505 | A1 | 7/2014 | Zhou et al. | |
| 2014/0974860 | | 12/2014 | Suzuki | |
| 2015/0042325 | A1* | 2/2015 | Snoeij | G01R 19/0092 324/251 |

OTHER PUBLICATIONS

"DRV425 Fluxgate Magnetic-Field Sensor", Product Datasheet, Texas Instruments Incorporated, Mar. 2016, accessed Dec. 8, 2017, http://www.ti.com/lit/ds/symlink/drv425.pdf.

* cited by examiner

SEMICONDUCTOR INTEGRATED FLUXGATE DEVICE SHIELDED BY DISCRETE MAGNETIC PLATE

TECHNICAL FIELD

This disclosure relates to the field of electronic systems and semiconductor devices and more specifically to structure and fabrication method of a semiconductor integrated fluxgate device.

BACKGROUND

Instruments to measure the quantity of electrical current are frequently ammeters based on galvanometers, where a pivoted coil of fine wire is placed in the magnetic field of a permanent magnet. Attached to the coil is a spring with a pointer. When current flows through the coil, the magnetic field exerts a torque on the coil and the pointer. The torque is directly proportional to the current. As the coil turns, the spring exerts a restoring torque proportional to the angular deflection. To measure currents larger than the full scale reading, shunt resistors are connected in parallel to the galvanometers.

Ammeters are also based on the Hall effect. A potential difference perpendicular to the direction of a current in a conductor placed in a magnetic field is determined. The Hall potential is determined by the requirement that the associated electrical field must just balance the magnetic field force on a moving charge. Hall sensors are typically used for applications that include the handling of high currents. Hall sensors, however, have limited performance due to their relatively low sensitivity, high offset and high noise.

Electrical current measurements using current flowing through a conductor are made by drilling a hole in the conductor and measuring the gradient of the magnetic field in the hole. The measurements are performed by placing a semiconductor device in the hole, the semiconductor device includes a magnetic sensor with a magnetic core. A current through the conductor can be measured based on a linear dependence on the magnetic field strength; however, early saturation of the magnetic core limits the range of the measurements.

SUMMARY

In a described example, a system for sensing current includes: a conductor for carrying a first electrical current generating a first magnetic field; a device spaced from the conductor by a first clearance, the device including a semiconductor integrated circuit die provided in a package; the semiconductor integrated circuit die including at least one elongated bar of a first ferromagnetic material magnetized by the first magnetic field; a sensor including a first coil wrapped around the at least one elongated bar configured to sense the magnetization of the at least one elongated bar; and an electronic driver configured to create a second electrical current flowing through a second coil wrapped around the at least one elongated bar, the second electrical current configured to generate a second magnetic field to compensate for the magnetization of the at least one elongated bar; the package having a first outer surface free of device terminals, and an opposite second outer surface including device terminals; and a discrete plate of a second ferromagnetic material in the first clearance, the discrete plate being conformal with the first outer surface of the package.

DETAILED DESCRIPTION

Corresponding numerals and symbols in the different figures generally refer to corresponding parts unless otherwise indicated. The figures are not necessarily drawn to scale.

As is further described hereinbelow, certain structures and surfaces are described as "parallel" to one another. For purposes of this disclosure, two elements are "parallel" when the elements are intended to lie in planes that, when extended, will not meet. However, the term parallel as used herein also includes surfaces that may slightly deviate in direction due to manufacturing tolerances, if the two surfaces generally lie in planes that are spaced apart and which would not intersect when extended infinitely if made the surfaces were made without these deviations, these surfaces are also parallel. Parallel surfaces extend in a direction side by side and do not meet.

In the description hereinbelow, certain elements are described as "coplanar". Coplanar elements lie in the same plane. However, in manufacturing, some variations on surface heights occur due to the tolerances of manufacturing. The term "coplanar" used herein means two elements intended to be in the same plane, even if slight differences in one or the other of the surfaces as manufactured are slightly out of plane. Elements positioned so the surfaces of the two elements are intended to lie in a common plane are coplanar.

Some elements are described hereinbelow as "conformal" to another element. A surface is "conformal" to another surface when it corresponds to the other surface and preserves the curves and angles of the other surface. The conformal surfaces can be spaced from one another.

Semiconductor magnetic fluxgate sensors are a family of devices for measuring electrical currents flowing in a conductor. For the measurements, the devices monitor a magnetic flux generated in a magnetic core by the magnetic field that is induced by the current to be measured. A magnetic core is positioned inside the sensor. Detecting this magnetic flux, the fluxgate sensor initiates in a driver unit an electrical compensation current, which flows through a compensation coil around the magnetic core as an opposing current and which generates an opposing magnetic field. The opposing current is varied to a compensation level which brings the original magnetic flux in the core back to zero. The opposing current then indicates the current to be measured.

The linearity of the relation between the induced magnetic flux and the compensation current in the coil is limited due to magnetic saturation of the magnetic core in the fluxgate device. Consequently, the magnitude of the current to be measured that the fluxgate can linearly handle is limited, in an example, to less than 100 A (when a clearance between a sensor and the current-carrying conductor to be measured is about approximately 1 millimeter). The arrangements and methods disclosed herein address these limitations.

Figure 1A:
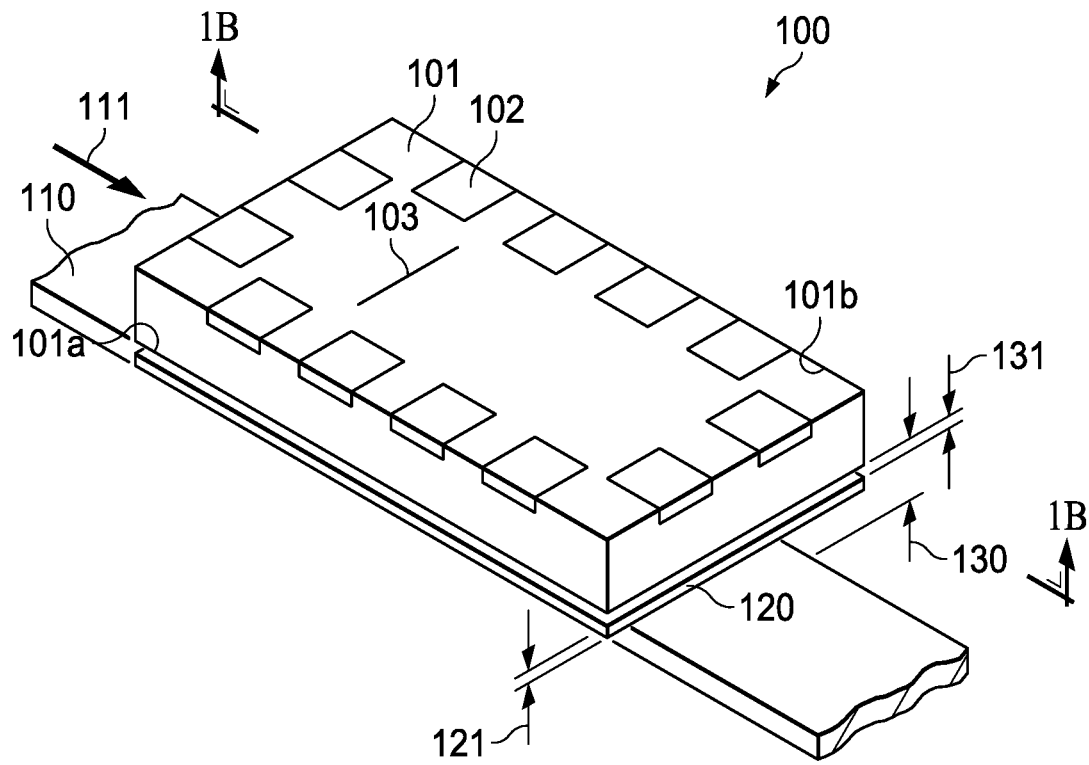
FIG. 1A illustrates a perspective view of a current-sensing system including a discrete magnetic plate as magnetic shield.
Figure 1B:
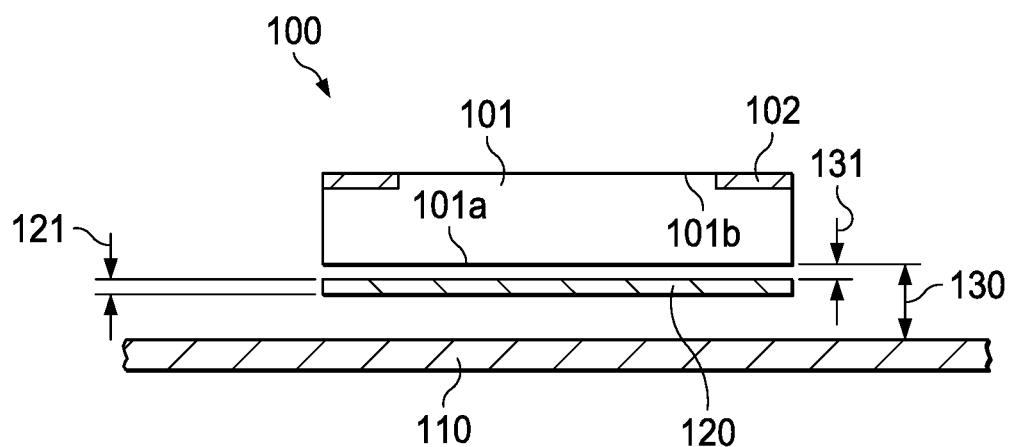
FIG. 1B shows a cross section of the system of FIG. 1A.

FIG. 1A illustrates an arrangement in a perspective view for a system for sensing and measuring a current; and FIG. 1B shows this system in cross section along line 1B-1B in FIG. 1A. In FIGS. 1A and 1B, a conductor 110 for carrying a first electrical current 111 is shown, which generates a first magnetic field; current 111 is the current to be measured. The direction of the current flow is indicated in FIG. 1A by the direction of the arrow 111.

The system of FIGS. 1A and 1B include a device generally designated 100, which is spaced from a conductor 110 by a first clearance 130. In the system of FIG. 1A, clearance 130 may be 1 mm. Device 100 includes a semiconductor integrated circuit die with an elongated bar (or a pair of elongated bars) made of a first ferromagnetic material (further described in conjunction with FIG. 4 hereinbelow); the die is encapsulated in a package 101. As used herein, "encapsulated" refers to the semiconductor integrated circuit die being covered with a mold compound to form a package. However, portions of the device including external terminals remain exposed even though the semiconductor die is described as being encapsulated in the package. Package 101 covers the semiconductor die (not visible in FIGS. 1A, 1B) but leaves the terminals 102 exposed, so that the semiconductor die within package 101 can be connected to electrically. Package 101 can be formed using semiconductor molding and encapsulation techniques such as transfer molding using thermoset mold compound. In an alternative, package 101 can be a glob top resin epoxy.

In the device example of FIG. 1A, package 101 can be square shaped with a side length of 4 mm and a thickness of 1 mm. Package 101 has a first outer surface 101a and an opposite second outer surface 101b. As FIG. 1A shows, second outer surface 101b includes a plurality of device terminals 102 exposed by package 101, while first outer surface 101a is free of device terminals. Second outer surface 101b further includes a marker 103, which is aligned with the elongated bar of the semiconductor die; marker 103 is at right angle with the direction of first current 111.

FIGS. 1A and 1B further include a discrete plate 120 positioned in the first clearance 130. Plate 120 is a flat sheet of metal of a thickness 121 of about 200 to 500 µm, parallel surfaces, and made of a second ferromagnetic material such as a FeSi alloy. In this description, "flat" means the surfaces of discrete plate 120 are generally smooth to the touch and free from visible dimples or protrusions, however in manufacturing some occasional slight irregularities in the surfaces can occur and the plate 120 can still be referred to as "flat." Preferably, the second ferromagnetic material has an isotropic magnetization curve and a permeability of about 1000; and the saturation magnetization is about 1.5 T. Discrete plate 120 has an uninterrupted and continuous configuration and is conformal with the first outer surface 101a of the device package 101.

The purpose of discrete plate 120 of ferromagnetic material is to act as a shield of the magnetic sensor inside device 100 and to weaken the magnetic field due to current 111 (as discussed further hereinbelow in conjunction with the descriptions of FIGS. 4 and 6). For a square shaped package 101 with a side length of 4 mm, plate 120 has a size 4 mm×4 mm. As FIG. 1A shows, in some devices discrete plate 120 is spaced from the first outer surface 101a of the package by a second clearance 131 smaller than the first clearance 130. In other systems, second clearance 131 vanishes and discrete plate 120 touches the first outer surface 101a of the package.

Figure 4:
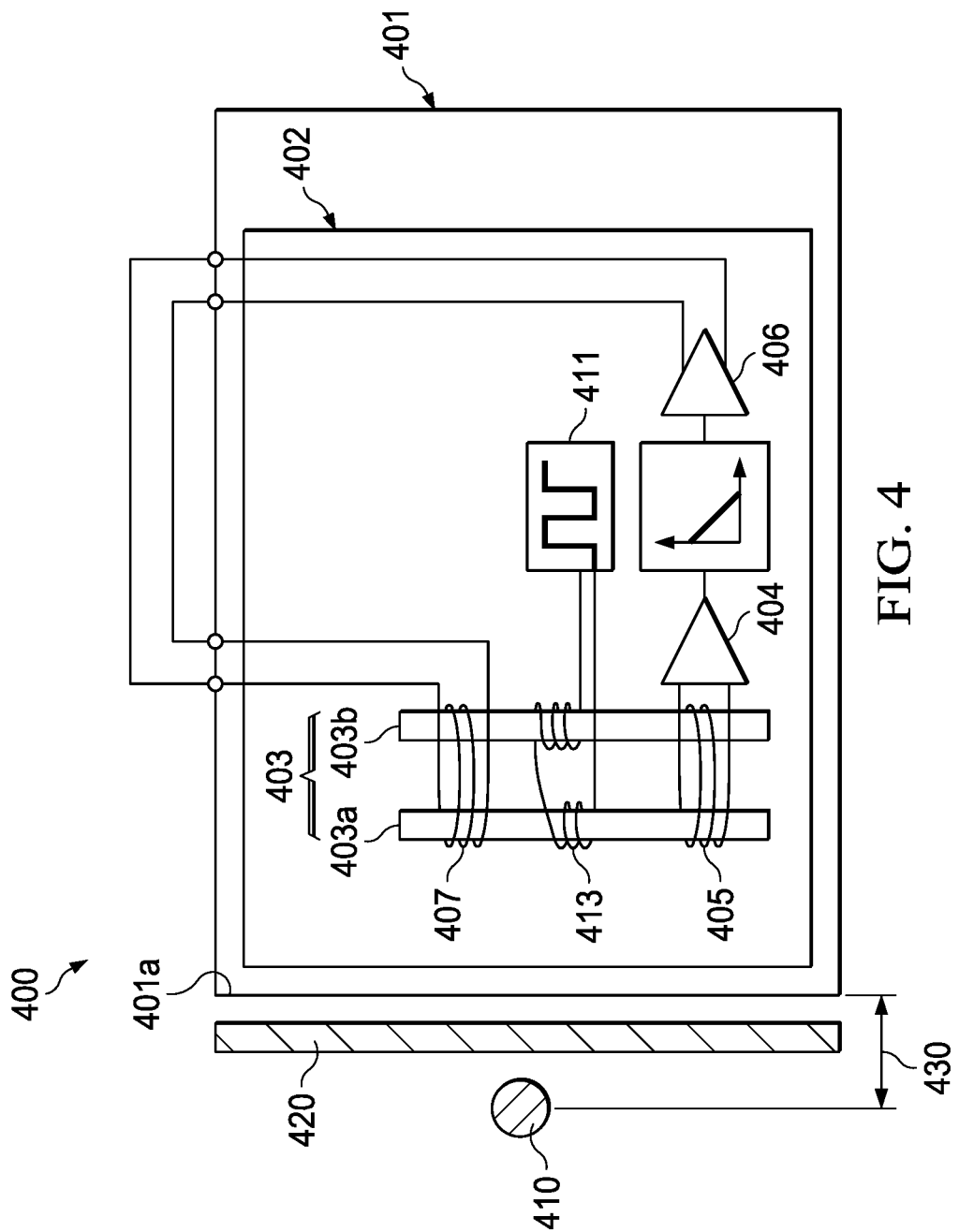
FIG. 4 is a diagram of a current-sensing system including a semiconductor fluxgate sensor shielded by a discrete magnetic plate.

Referring now to FIG. 4, similar numerals and symbols in FIG. 4 refer to corresponding parts in FIG. 1, for clarity. For example, device 400 corresponds to device 100 in FIG. 1. Device 400 has inside package 401 a semiconductor integrated circuit die 402. Die 402 includes a core 403, here implemented by a pair of elongated bars 403a, 403b of a first ferromagnetic material. In an alternative arrangement, the pair of bars 403a, 403b can be replaced by a single bar of the first ferromagnetic material. However, in operation the core 403 is excited by a periodic excitation signal from an excitation circuit 411 to saturate the core in one direction, and then allowing the core to saturate in the other direction. During recovery, flux due to the ambient signal is sensed. By using two parallel rods excited in opposite directions by an excitation coil 413, a sensing coil 405 senses the flux changes due to the ambient signal, while the flux due to the excitation signals (in opposite directions on the parallel rods 403a, 403b) cancels out in the sensing coil. However a single rod arrangement can be used as a core 403 with appropriate circuitry to isolate the sensed flux changes due to the ambient signal from the flux sensed due to the excitation signal. Core 403 is magnetized by the first magnetic field of the first electrical current flowing in conductor 410. The conductor 410 in FIG. 4 is shown as a round metallic wire perpendicular to the plane of the drawing and spaced from package 401 by first clearance 430. Inserted in clearance 430 and parallel to surface 401a of device package 401 is discrete metallic plate 420 made of a ferromagnetic material. A sensor 404 integrated with die 402 comprises a first coil 405 wrapped around the elongated bar to sense the bar's magnetization. An electronic driver 406 creates a second electrical current flowing through a second coil 407 wrapped around the elongated bar 403 and generates an opposite second magnetic field of a size to compensate the bar's magnetization and to bring the original magnetic field at the sensor back to zero.

Figure 6:
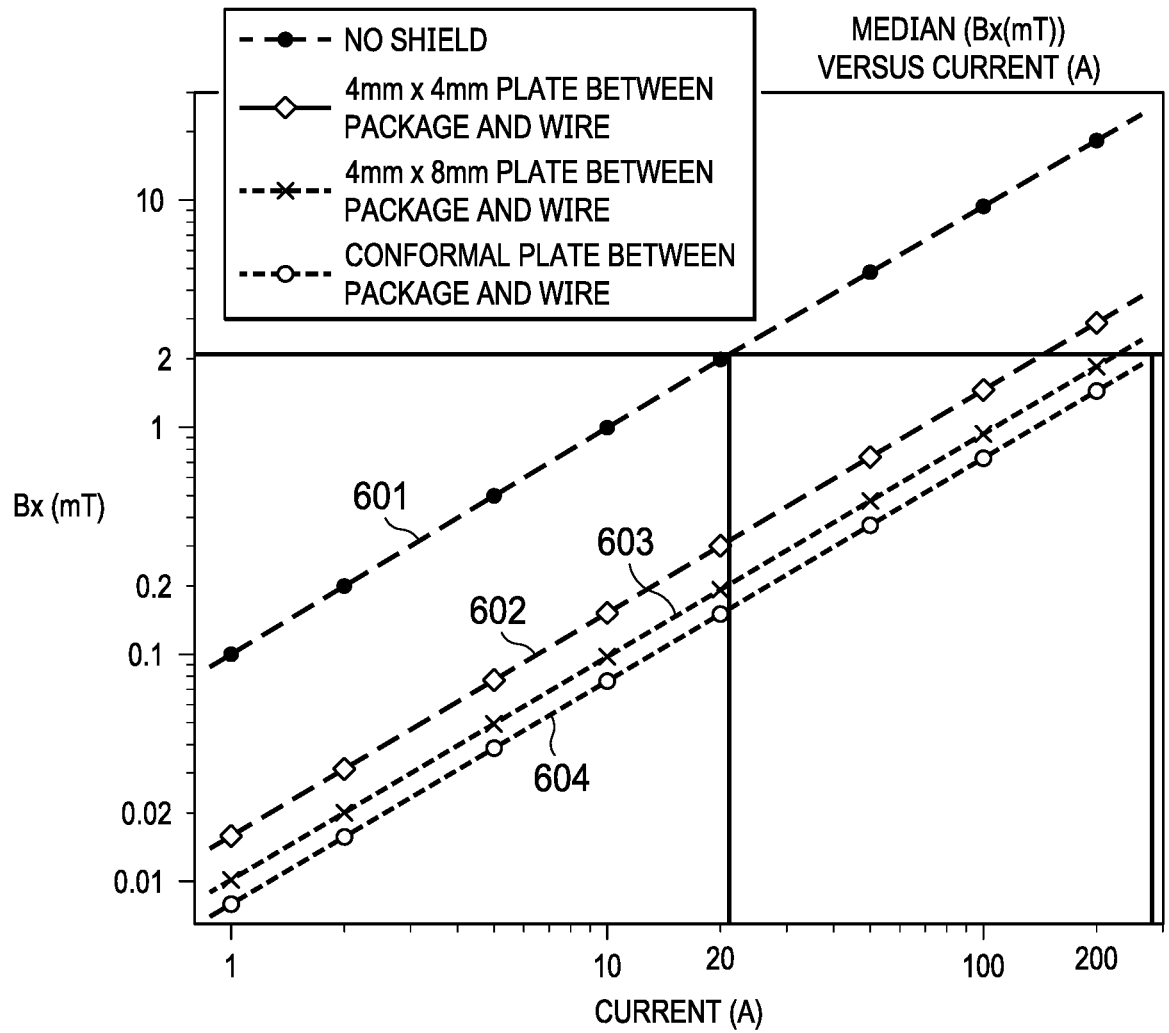
FIG. 6 shows Ansys Maxwell 3D simulation data in a double logarithmic plot of median magnetization as a function of current, without and with magnetic shield.

Referring now to FIG. 6, FIG. 6 is a diagram that illustrates the effect of plate 420 as a magnetic shield between device package 401 and current-carrying wire 410 (see FIG. 4). The diagram of FIG. 6 shows Ansys Maxwell 3D simulation data in a double logarithmic plot of the median magnetization $B_x$ (measured in milliTesla (mT)) of core 403 as a function of the current (measured in ampere A) in conductor 410. In the double logarithmic plot, the relationship between magnetization and current is linear and therefore allows a reliable and unequivocal measurement of the current using the fluxgate sensor.

Curve 601 of FIG. 6 refers to data obtained without magnetic shield 420 and thus plots the uninhibited effect of the current's magnetic field on core 403. As curve 601 shows, the linear relationship between magnetization and current holds to a current of 20 A, where saturation magnetization of the core 403 is reached with the application of about 2.0 mT (with a clearance between the current-carrying conductor and the sensor of about 1 millimeter.) Currents around 20 A indicate the limit of reliable and unequivocal current measurements by the fluxgate sensor.

On the other hand, curve 602 in FIG. 6 plots data obtained when a 4 mm×4 mm magnetic plate 420 is inserted as magnetic shield between package 401 and conductor 410. As curve 602 shows, the linear relationship between magnetization and current is now extended to a current in conductor 410 between about 130 and 140 A. Consequently, with the magnetic shield 420 the limit of reliable and unequivocal current measurements by the fluxgate sensor can be extended to currents well beyond 100 A.

Figure 2A:
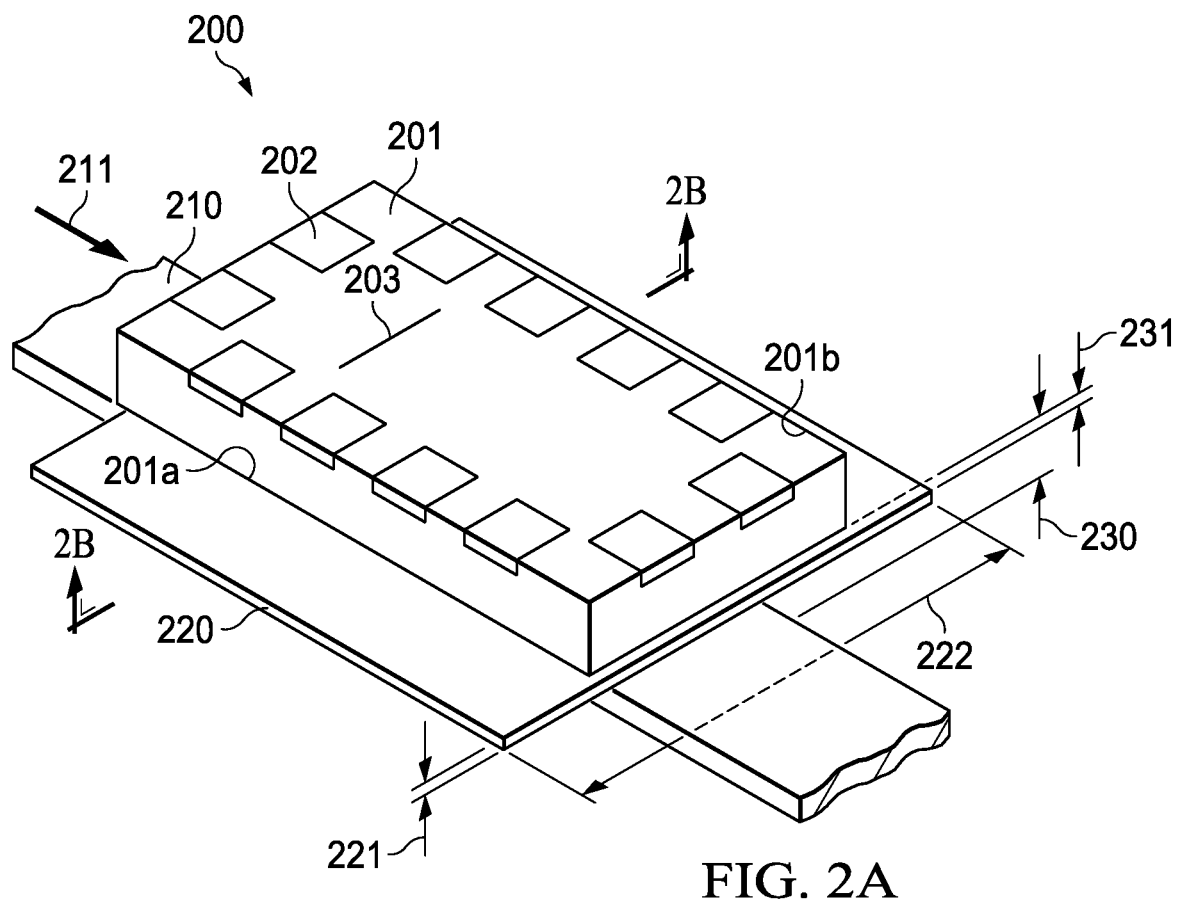
FIG. 2A displays a perspective view of a current-sensing system including a discrete elongated magnetic plate as magnetic shield.
Figure 2B:
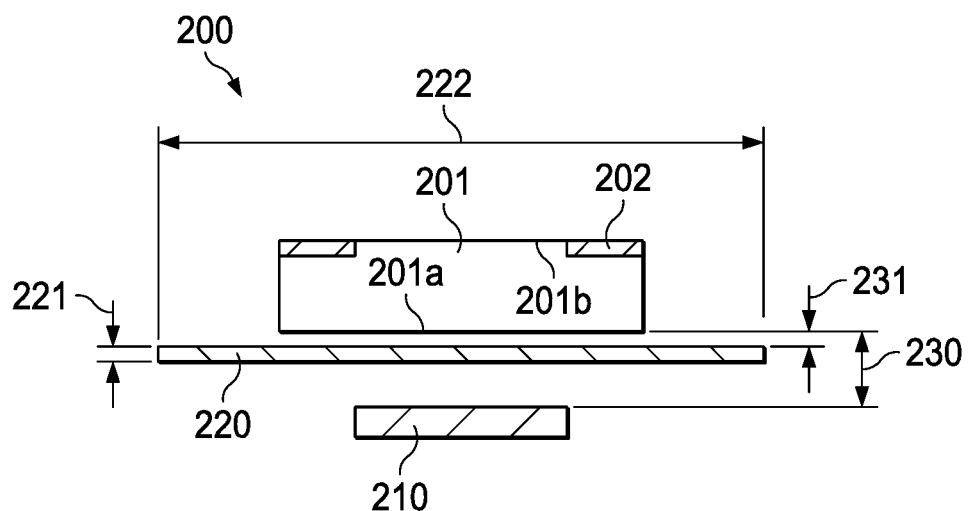
FIG. 2B shows a cross section of the system of FIG. 2A.

The perspective view of FIG. 2A and the cross section of FIG. 2B along line 2B-2B in FIG. 2A show another arrangement, which is a system for sensing and measuring a first current 211 carried in conductor 210. Reference labels for the similar elements in FIGS. 2A and 2B are similar to the reference labels of FIGS. 1A and 1B, for clarity. For example, package 201 corresponds to package 101 in FIG. 1A. The system of FIGS. 2A and 2B includes a device 200 spaced from conductor 210 by a first clearance 230. In the device example of FIG. 2A, clearance 230 may be 1 mm. Device 200 includes a semiconductor integrated circuit die (not visible in FIGS. 2A, 2B) with at least one elongated bar made of a first ferromagnetic material (described in conjunction with FIG. 4 hereinabove) or alternatively, a pair of elongated bars positioned with an excitation coil; the semiconductor integrated circuit die is encapsulated in package 201. Package 201 covers the semiconductor integrated circuit die in a mold compound material, however terminals 202 remain exposed to allow electrical connection to the semiconductor integrated circuit die within the package 201. Package 201 may be square shaped with a side length of 4 mm and a thickness of 1 mm; the package has a first outer surface 201a and an opposite second outer surface 201b. Second outer surface 201b includes a plurality of device terminals 202, while first outer surface 201a is free of device terminals. Second outer surface 201b further includes a marker 203, which is aligned with the elongated bar of the semiconductor die; marker 203 is at right angle with the direction of first current 211.

The arrangement of FIGS. 2A and 2B includes a discrete plate 220 positioned in the first clearance 230. Plate 220 is a flat sheet of metal of a thickness 221 of about 200 to 500 μm, parallel surfaces, and made of a second ferromagnetic material such as a ferrosilicon (FeSi) alloy. Preferably, the second ferromagnetic material has an isotropic magnetization curve and a permeability of about 1000; the saturation magnetization is about 1.5 T. Discrete plate 230 has an uninterrupted and continuous configuration and is conformal with the first outer surface 201a of the device package 201. As FIGS. 2A and 2B show, plate 230 has only one lateral dimension sized as a dimension of package 201; the other dimension 222, however, is considerably longer than the package dimension and the width of conductor 210.

The purpose of plate 220 of ferromagnetic material is to act as a shield for the magnetic sensor inside device 200 to weaken the magnetic field of first current 211 (as discussed further hereinabove, see the descriptions of FIG. 4 and FIG. 6). As FIG. 2A shows, in some devices discrete plate 220 is spaced from the first outer surface 201a of package 201 by a second clearance 231 smaller than the first clearance 230. In other devices, second clearance 231 vanishes and discrete plate 220 touches the first outer surface 201a of the package.

Referring now to FIG. 6, the diagram illustrates the effect of plate 220 as a magnetic shield between device package 201 and current-carrying wire 210. As stated, the diagram of FIG. 6 shows a double logarithmic plot of the median magnetization B (measured in mT) of core 403 in FIG. 4 as a function of the current (measured in A) in conductor 210. In the double logarithmic plot, the relationship between magnetization and current is linear and therefore allows a reliable and unequivocal measurement of the current using the fluxgate sensor.

Curve 603 refers to data obtained when a magnetic plate 220 with the long dimension 222 is inserted as magnetic shield between package 201 and conductor 210. As curve 603 shows, the linear relationship between magnetization and current can now be extended to a current in conductor 210 of approximately 200 A. Consequently, with the use of the arrangements and magnetic shield 220, the limit of reliable and unequivocal current measurements by the fluxgate sensor can be extended to currents in the range of 200 A.

Figure 3A:
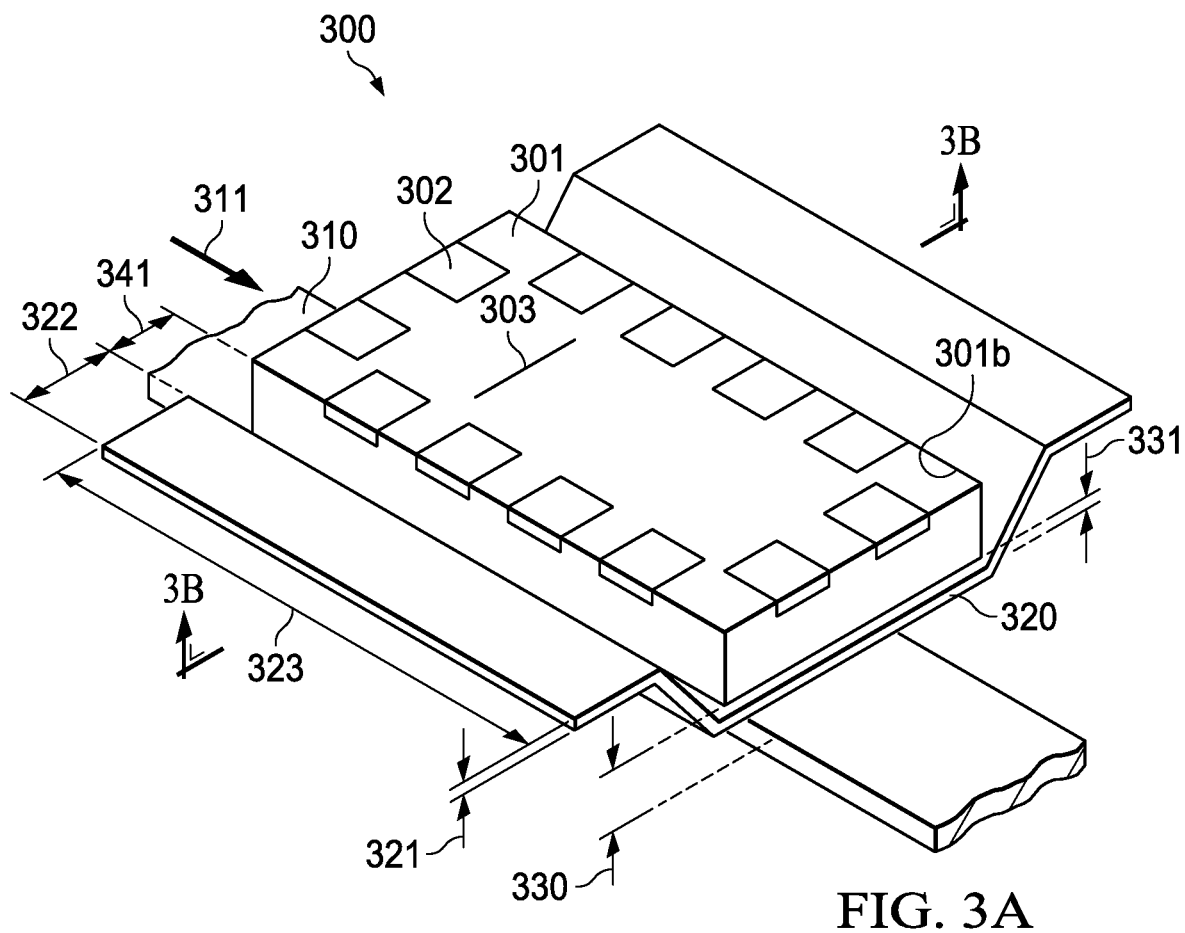
FIG. 3A illustrates a perspective view of a current-sensing system including a discrete magnetic plate conformal with the package of the sensor device.
Figure 3B:
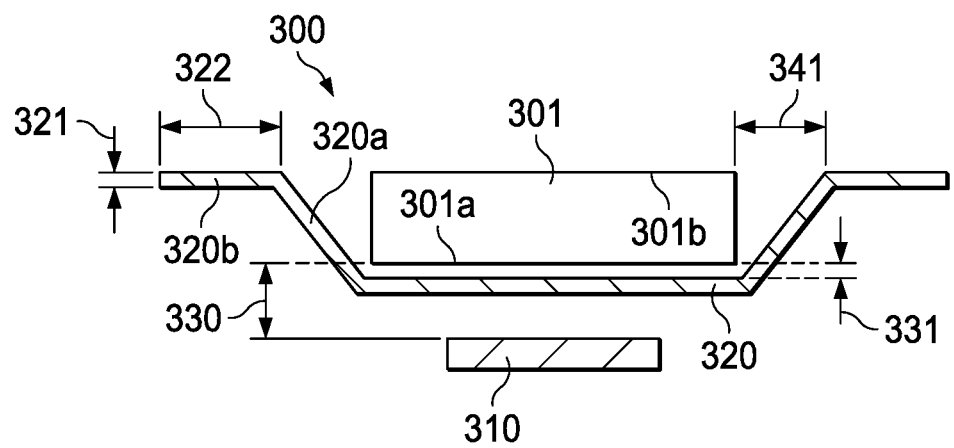
FIG. 3B shows a cross section of the system of FIG. 3A.

The perspective view of FIG. 3A and the cross section of FIG. 3B along line 3-3 show another arrangement, a system for sensing and measuring a first current 311 carried in conductor 310. In FIGS. 3A-3B, the reference labels used for elements similar to those in FIGS. 1A-1B are similar, for clarity. For example, conductor 310 corresponds to conductor 110 in FIG. 1. The system of FIGS. 3A and 3B include a device 300 spaced from conductor 310 by a first clearance 330. In the device example of FIG. 3A, clearance 330 may be 1 mm. Device 300 includes a semiconductor integrated circuit die (not visible in FIGS. 3A-3B) with at least one elongated bar made of a first ferromagnetic material or alternatively a pair of elongated bars (described hereinabove in conjunction with FIG. 4); the die is encapsulated in package 301. While the die is described as encapsulated by package 301, package 301 covers the semiconductor integrated circuit die in mold compound but nonetheless terminals 302 remain exposed to allow electrical connection to be made to the semiconductor integrated circuit die within package 301. Package 301 may be square shaped with a side length of 4 mm and a thickness of 1 mm; the package has a first outer surface 301a and an opposite second outer surface 301b. Second outer surface 301b includes a plurality of device terminals 302, while first outer surface 301a is free of device terminals. Second outer surface 301b further includes a marker 303, which is aligned with the elongated bar of the semiconductor die; marker 303 is at right angle with the direction of first current 311.

The arrangement of FIGS. 3A and 3B includes a discrete plate 320 partially positioned in the first clearance 330. Plate 320 is made of a sheet of metal of a thickness 321 of about 200 to 500 μm; the surfaces of the sheet are parallel to respective opposite sheet surfaces. The sheet is made of a second ferromagnetic material such as a FeSi alloy. Preferably, the second ferromagnetic material has an isotropic magnetization curve and a permeability of about 1000; the saturation magnetization is about 1.5 T. Discrete plate 330 has an uninterrupted and continuous configuration, and is bent to be conformal with outer surfaces of the device package 301. In the example of FIGS. 3A and 3B, plate 320 has a flat portion parallel to first surface 301a; the flat portion may be spaced from first surface 301a by a second clearance 331 smaller than first clearance 330; second clearance 331 may vanish in some systems so that the flat plate portion touches first device surface 301a. Following the contours of package 301, plate 320 bends at an angle against the package side walls forming portions 320a, which may have a distance 341 from the package (about 1 mm in the device example of FIGS. 3A and 3B). Thereafter, plate 320 is again bent at an angle into portions 320b, which are coplanar with the second package surface 301b. In the example of FIGS. 3A and 3B, portions 320b have a length 322 of about 1 mm and act like flanges to shield the circuitry of device 300 from the magnetic fields of currents in conductor 310. Flanges 322 of plate 320 enable this shielding function even after the terminals 302 of device 300 have been soldered to a PCB (printed circuit board).

Referring now to FIG. 6, the diagram illustrates the effect of conformal plate 320 as a magnetic shield between device package 301 and current-carrying wire 310. As stated, the diagram of FIG. 6 shows a double logarithmic plot of the median magnetization B (measured in mT) of core 403 in FIG. 4 as a function of the current (measured in A) in conductor 310. In the double logarithmic plot, the relationship between magnetization and current is linear and therefore allows a reliable and unequivocal measurement of the current using the fluxgate sensor.

Curve 604 refers to data obtained when a magnetic plate 320 conformal with the contours of package 301 is inserted as magnetic shield between package 301 and conductor 310. As curve 604 shows, the linear relationship between magnetization and current can now be extended to a current in conductor 310 of approximately 300 A. Consequently, with the magnetic shield 320 of the arrangements the limit of reliable and unequivocal current measurements by the fluxgate sensor can be extended to currents in the range of 300 A.

Figure 5:
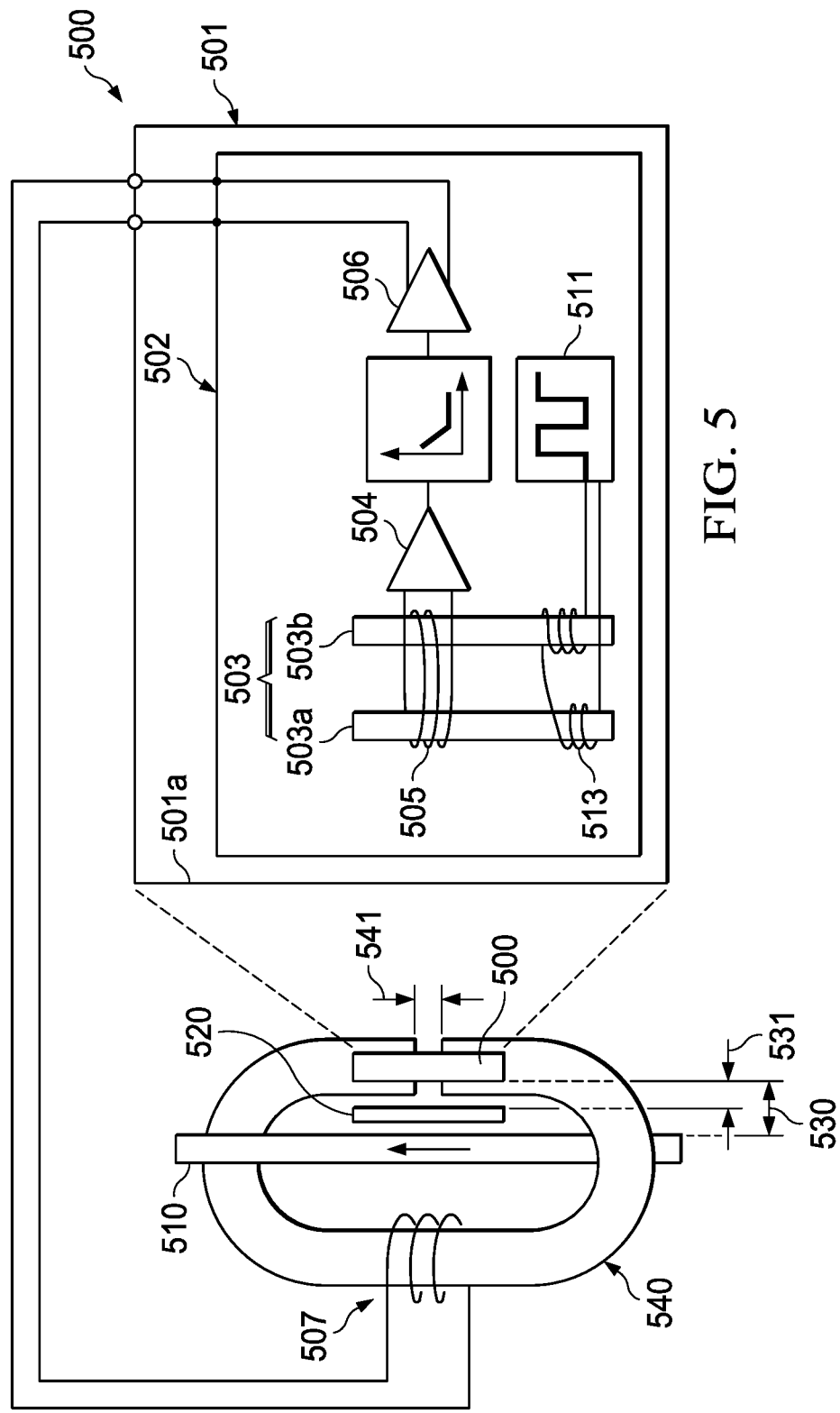
FIG. 5 is a diagram of another current-sensing system including a semiconductor fluxgate sensor shielded by a discrete magnetic plate.

FIG. 5 illustrates another arrangement for a current-sensing system that includes a core 540 of a first ferromagnetic material shaped as a toroid. The toroid includes an air gap with width 541. Traversing the toroid is a conductor 510 for carrying a first electrical current. As shown in FIG. 5, conductor 510 can be shaped as an elongated wire traversing the toroid. The magnetic field of the first current generates a first magnetic flux in the toroid, which continues across the air gap with width 541.

FIG. 5 indicates schematically that a device 500 is positioned in the air gap and spaced from conductor 510 by a first clearance 530. As depicted in FIG. 5 by the enlargement of device 500, the device includes a semiconductor integrated circuit die 502 encapsulated by a package 501. The semiconductor integrated circuit die includes a sensor 504 including a sensing coil 505 wrapped around a core 503 including a pair of elongated bars 503a, 503b of a second ferromagnetic material to sense the bar's magnetization. An excitation circuit 511 applies an excitation signal, a periodic signal such as a square wave or sine wave, to an excitation coil 513 positioned with the pair of elongated bars 503a, 503b. As described hereinabove, the excitation signal will cause the elongated bars 503a, 503b that make up the core 503 to reach saturation in a first direction, and then in a second direction, due to the coil 513 arrangement the flux due to the two elongated bars is opposite and will cancel in the sensing coil 505. In an alternative arrangement, a single rod can form core 503, and additional circuitry can remove flux due to the excitation signal from the flux sensed by coil 505. Package 501 has a first outer surface 501a free of device terminals and an opposite second outer surface, which includes device terminals and a marker aligned with core 503.

The system of FIG. 5 includes a discrete plate 520 of a third ferromagnetic material, such as a FeSi compound. The third ferromagnetic material is a homogeneous and pliable alloy with a permeability greater than 500 and a saturation magnetic flux density between about 0.5 and 2.4 T. The thickness of the plate may be in the range from about 200 μm to 500 μm. Plate 520 is positioned in clearance 530 conformal with the first outer surface 501a at a second clearance 531 from first outer surface 501a smaller than first clearance 530. Discrete plate 520 has an uninterrupted and continuous configuration and is conformal with the first outer surface 501a of the package 501; preferably, discrete plate 520 is flat and parallel to the first outer surface of the package. In some systems, the discrete plate 520 is spaced from the first outer surface 501a by a clearance; in other systems, the clearance vanishes and the discrete plate touches the first outer surface of the package. In yet other systems, the discrete plate 520 has a ring-like shape at least partially surrounding the package. The ring-like shape is circular or oval and can be a partial circle or oval.

Device 500 further includes an electronic driver 506, which creates a second electrical current flowing outside the device to a second coil 507 wrapped around core 593. The magnetic field generated by the second electrical current in the second coil 507 causes a second magnetic flux in the toroid 540 for compensating the first magnetic flux.

Figure 7:
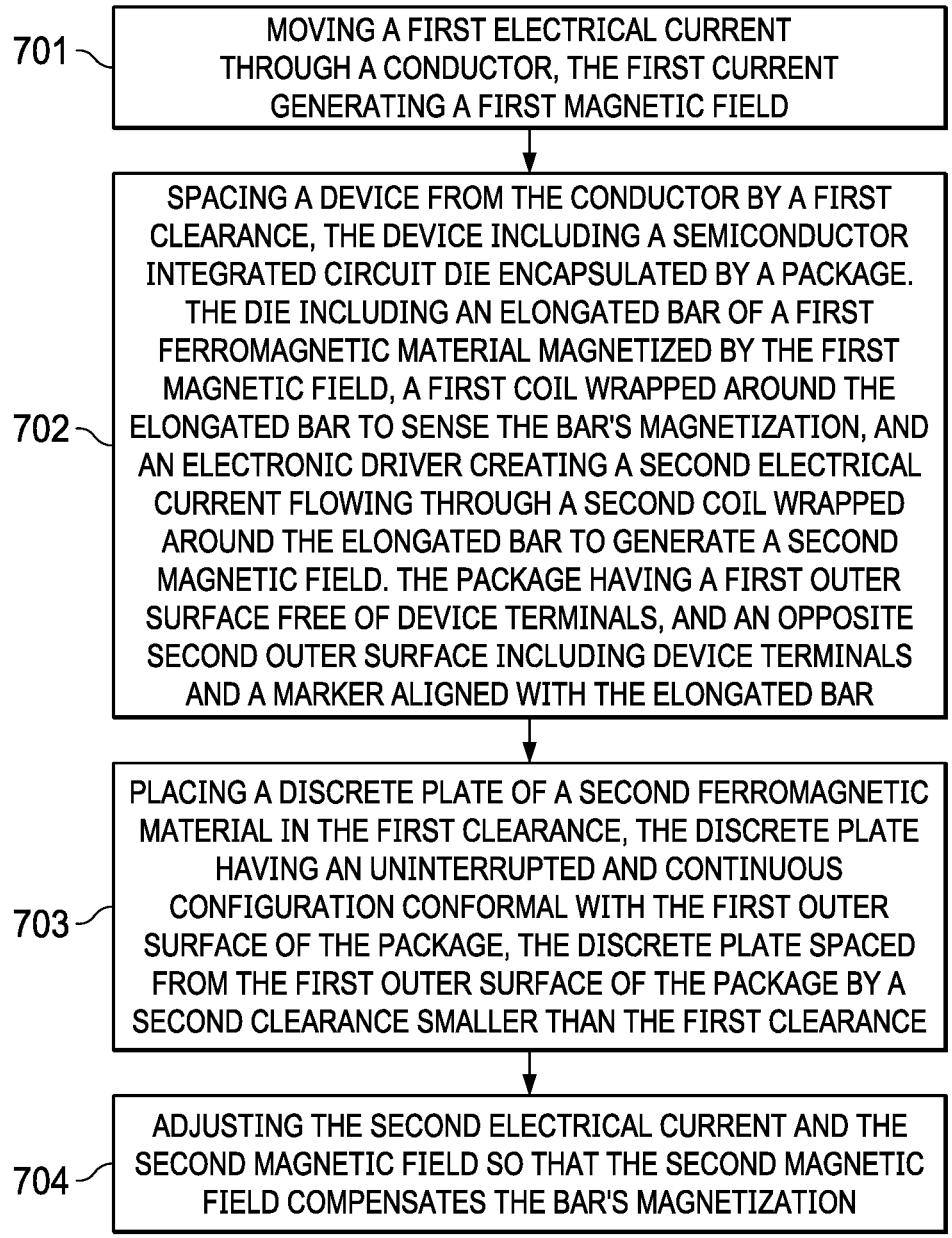
FIG. 7 is a flow diagram displaying steps of a method for fabricating a system with a magnetically shielded sensor of electrical currents.

FIG. 7 is a flow diagram showing steps of a method arrangement. The method is for fabricating a system with a magnetically shielded sensor for electrical currents. The method is summarized by the process steps listed in FIG. 7, starting at step 701. During step 701, a first electrical current is moved through a conductor; and the first electrical current generates a first magnetic field.

During the next process step 702, a device is spaced from the conductor by a first clearance. The device includes a semiconductor integrated circuit die encapsulated by a package, the package not covering device terminals as described hereinabove. In turn, the die includes an elongated bar of a first ferromagnetic material magnetized by the first magnetic field, further a first coil wrapped around the elongated bar to sense the bar's magnetization, and an electronic driver creating a second electrical current flowing through a second coil wrapped around the elongated bar to generate a second magnetic field. The package of the device has a first outer surface free of device terminals and an opposite second outer surface, which includes exposed device terminals. The package preferably includes a marker aligned with the elongated bar.

During the next process step 703, a discrete plate of a second ferromagnetic material is placed in the first clearance. The discrete plate has an uninterrupted and continuous configuration conformal with the first outer surface of the package, and is spaced from the first outer surface of the package by a second clearance smaller than the first clearance.

During the next process step 704, the second electrical current and the second magnetic field are adjusted so that the second magnetic field compensates the bar's magnetization.

Various modifications and combinations of the arrangements described herein, as well as other arrangements, will be apparent upon reference to the description. As an example, the arrangements apply not only to systems with devices having hexahedron shaped packages, but also to systems with devices in packages of any configuration and with devices operating without packages.

As another example, the arrangements apply not only to systems with silicon-based semiconductor devices, but also to systems with devices using gallium arsenide, gallium nitride, silicon germanium, and any other semiconductor material employed in industry.

Modifications are possible in the described arrangements, and other arrangements are possible, within the scope of the claims.

What is claimed is:

1. A system for sensing current, comprising:
a conductor for carrying a first electrical current generating a first magnetic field;
a device spaced from the conductor by a first clearance, the device including a semiconductor integrated circuit die provided in a package;
the semiconductor integrated circuit die including at least one elongated bar of a first ferromagnetic material magnetized by the first magnetic field;
the package having a first outer surface free of device terminals, and an opposite second outer surface including device terminals; and
a discrete plate of a second ferromagnetic material in the first clearance, the discrete plate being conformal with the first outer surface of the package.

2. The system of claim 1 wherein the first ferromagnetic material is a homogeneous alloy with a saturation magnetization reached on application of about 2 mT.

3. The system of claim 1 wherein the second ferromagnetic material is a homogeneous alloy with a permeability greater than 500 and a saturation magnetic flux density between about 0.5 and 2.4 T.

4. The system of claim 3 wherein the discrete plate has a thickness in a range of about 200 and 500 μm.

5. The system of claim 4 further including a marker on the second outer surface of the package, the marker being aligned with the at least one elongated bar.

6. The system of claim 3 wherein the discrete plate is flat and parallel to the first outer surface of the package.

7. The system of claim 6 wherein the discrete plate is spaced from the first outer surface of the package by a second clearance less than the first clearance.

8. The system of claim 6 wherein the discrete plate touches the first outer surface of the package.

9. The system of claim 1 wherein the semiconductor integrated circuit die includes a sensor including a first coil wrapped around the at least one elongated bar configured to sense the magnetization of the at least one elongated bar, and an electronic driver configured to create a second electrical current flowing through a second coil wrapped around the at least one elongated bar, the second electrical current configured to generate a second magnetic field to compensate for the magnetization of the at least one elongated bar.

10. The system of claim 1, wherein the at least one elongated bar further includes a pair of elongated bars of the first ferromagnetic material positioned with an excitation coil surrounding the elongated bars.

* * * * *